US008764900B2

(12) United States Patent
Takano et al.

(10) Patent No.: US 8,764,900 B2
(45) Date of Patent: Jul. 1, 2014

(54) APPARATUS AND METHOD FOR PRODUCING SINGLE CRYSTALS

(75) Inventors: Kiyotaka Takano, Nishishirakawa (JP); Masahiko Urano, Nishishirakawa (JP); Ryoji Hoshi, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 836 days.

(21) Appl. No.: 12/310,776

(22) PCT Filed: Aug. 20, 2007

(86) PCT No.: PCT/JP2007/066094
§ 371 (c)(1),
(2), (4) Date: Mar. 6, 2009

(87) PCT Pub. No.: WO2008/050524
PCT Pub. Date: May 2, 2008

(65) Prior Publication Data
US 2009/0249995 A1    Oct. 8, 2009

(30) Foreign Application Priority Data

Oct. 24, 2006   (JP) ................................. 2006-288360

(51) Int. Cl.
| C30B 11/00 | (2006.01) |
| C30B 15/00 | (2006.01) |
| C30B 21/06 | (2006.01) |
| C30B 27/02 | (2006.01) |
| C30B 28/10 | (2006.01) |
| C30B 30/04 | (2006.01) |

(52) U.S. Cl.
USPC .................... 117/15; 117/11; 117/13; 117/14

(58) Field of Classification Search
USPC ................ 117/13–15, 200–204, 217, 218, 11
See application file for complete search history.

(56) References Cited

U.S. PATENT DOCUMENTS

| 2002/0121238 A1* | 9/2002 | Falster et al. ................... 117/34 |
| 2003/0070605 A1* | 4/2003 | Hoshi et al. ..................... 117/13 |

(Continued)

FOREIGN PATENT DOCUMENTS

| EP | 0 781 866 A2 | 7/1997 |
| JP | 5-148081 A | 6/1993 |

(Continued)

OTHER PUBLICATIONS

Official Action dated Jun. 9, 2011 in counterpart German Patent Application No. 11 2007 002 336.8 (with English translation).

(Continued)

*Primary Examiner* — James McDonough
(74) *Attorney, Agent, or Firm* — Oliff PLC (57) ABSTRACT

The present invention provides an apparatus for producing single crystals according to the Czochralski method, the apparatus including a chamber that can be divided into a plurality of chambers; at least one of the plurality of divided chambers having a circulating coolant passage in which a circulating coolant for cooling the chamber circulates; and measuring means that respectively measure an inlet temperature, an outlet temperature, and a circulating coolant flow rate of the circulating coolant in the circulating coolant passage; the apparatus further including a calculating means that calculates a quantity of heat removed from the chamber and/or a proportion of the quantity of removed heat, from the measured values of the inlet temperature, outlet temperature, and circulating coolant flow rate; and a pulling rate control means that controls a pulling rate of the single crystal based on the resulting quantity of removed heat and/or the resulting proportion of the quantity of removed heat. The invention also provides a method for producing single crystals using the apparatus. Thus, an apparatus and a method for producing single crystals are provided for producing single crystals while easily stabilizing the crystal quality.

16 Claims, 4 Drawing Sheets

(56) References Cited

U.S. PATENT DOCUMENTS

| | | | |
|---|---|---|---|
| 2003/0183163 A1* | 10/2003 | Kubo et al. | 117/213 |
| 2006/0272570 A1* | 12/2006 | Hoshi et al. | 117/20 |
| 2007/0000429 A1* | 1/2007 | Iida | 117/13 |
| 2009/0249995 A1* | 10/2009 | Takano et al. | 117/15 |

FOREIGN PATENT DOCUMENTS

| | | | |
|---|---|---|---|
| JP | A-6-211589 | 8/1994 | |
| JP | A-8-268794 | 10/1996 | |
| JP | A-2002-53389 | 2/2002 | |
| JP | A-2004-338979 | 12/2004 | |
| JP | A-2005-132665 | 5/2005 | |
| JP | A-2005-187244 | 7/2005 | |
| JP | A-2005-247629 | 9/2005 | |
| WO | WO 01/57293 A1 | 8/2001 | |
| WO | WO 2005 042811 * | 5/2005 | C30B 15/20 |

OTHER PUBLICATIONS

German Office Action dated Apr. 10, 2013 from German Patent Application No. 11 2007 002 336.8 (with English-language translation).

* cited by examiner

APPARATUS AND METHOD FOR PRODUCING SINGLE CRYSTALS

TECHNICAL FIELD

The present invention relates to an apparatus for producing single crystals, such as silicon and the like, and to a method for producing single crystals, according to the Czochralski method.

BACKGROUND ART

The Czochralski method (the CZ method) is known as a conventional method for growing a silicon single crystal, whereby a silicon single crystal of high purity for use as a semiconductor is grown from a silicon melt in a quartz crucible supported by a graphite crucible. This method is performed as follows. A seed crystal is mounted on a seed crystal holder, which is suspended via a wire in a chamber above crucibles from a rotation and pulling mechanism located at the top of a chamber. The wire is then drawn to bring the seed crystal into contact with the silicon melt. The seed crystal is pulled upward by the Dash necking method, the dislocation-free seeding method, or the like to prepare a neck portion from the silicon melt, and subsequently, the crystal is allowed to grow gradually to a target diameter. In this way, a dislocation-free single-crystal ingot having a desired plane orientation can be produced.

Figure 2:
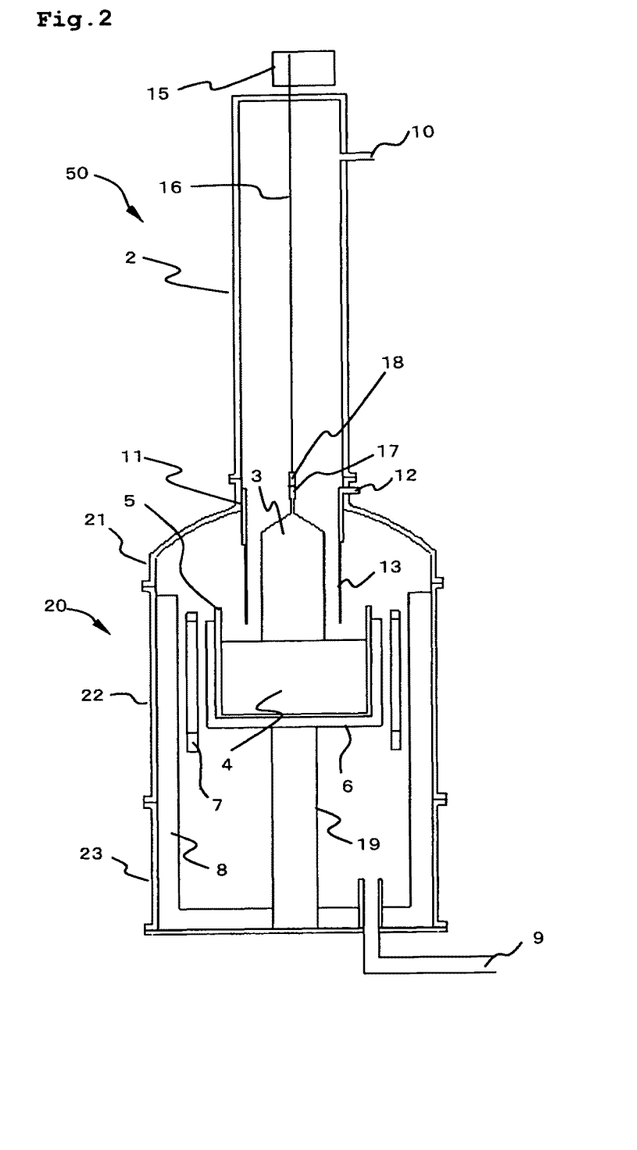
FIG. 2 is a schematic cross section showing an example of a general single-crystal production apparatus.

FIG. 2 shows a general example of the structure of a single-crystal production apparatus using a wire.

In the single-crystal production apparatus 50, a main chamber 20, which is composed of a top chamber 21, a middle chamber 22, a bottom chamber 23, and the like, houses crucibles 5, 6 that contain a raw material melt 4, a heat generator 7 for heating and melting the polycrystalline raw material, and the like. The crucibles 5, 6 are supported on a crucible-rotating shaft 19 that is capable of rotating and ascending or descending via a rotation drive mechanism not shown in the figure. The heat generator 7 is located to surround the crucibles 5, 6 to heat the raw material melt 4. On the exterior of the heat generator 7, a heat insulating member 8 is located to surround the heat generator 7 to prevent direct radiation of heat from the heat generator 7 into the main chamber 20.

Located at the top of the pull chamber 2 immediately above the main chamber 20 is a pulling mechanism 15 for pulling a grown single-crystal ingot 3. A pulling wire 16 is wound down from the pulling mechanism 15, and a seed holder 18 for mounting a seed crystal 17 is connected to the end of the wire. The seed crystal 17 mounted on the end of the seed holder 18 is immersed in the raw material melt 4, and the pulling wire 16 is wound up via the pulling mechanism. In this way, the single-crystal ingot 3 is pulled upward below the seed crystal 17 and grown.

For the purpose of, for example, discharging impurity gases produced inside the furnace from the furnace, an inert gas, such as argon gas or the like, is introduced into the pull chamber 2 and main chamber 20 via a gas inlet 10 located at an upper portion of the pull chamber 2. The inert gas passes along the single-crystal ingot 3 that is being pulled and passes over the melt 4, and circulates in the pull chamber 2 and main chamber 20, after which it is discharged via a gas outlet 9.

Each of the chambers has a coolant passage, which is not shown in the figure, and the coolant passage has an inside structure that allows a coolant for cooling the chamber to circulate, so as to protect each chamber, and block the radiation of heat from the heat generator 7 inside the chamber so that the heat is not transferred outside of the single-crystal production apparatus 50.

The pulling rate of the single-crystal ingot 3, i.e., the crystal growth rate, is determined according to the heat balance of the growing single crystal. The quantity of heat incorporated into the single crystal is classified into the quantity of inflow heat, which flows into the single crystal from the melt and heat generator; and latent heat of solidification, which is generated when the melt is crystallized. In consideration of the heat balance of the growing single crystal, the quantity of outflow heat, which is released out of the single crystal via the crystal surface and seed crystal, is equivalent to the sum of the quantity of inflow heat and latent heat of solidification. Latent heat of solidification depends upon the volume of the growth of the single crystal per unit time; hence, in order to increase the rate of crystal growth, it is necessary to compensate for the increment in the latent heat of solidification due to the increase in the crystal growth rate, by increasing the quantity of outflow heat.

In general, a method for increasing the quantity of outflow heat by effectively removing the heat released from the crystal surface is employed. For example, an apparatus has been suggested wherein a cooling cylinder 11, a cooling auxiliary member 13 that extends below the cooling cylinder 11, and the like are located inside the main chamber 20 to surround the single-crystal ingot 3 being pulled, to effectively cool the single-crystal ingot 3 being pulled, thereby increasing the pulling rate. Such an apparatus is disclosed in, for example, Japanese Unexamined Patent Publication No. H6-211589. This apparatus includes a gas-flow-guide cooling cylinder having a dual structure of an outer cooling cylinder made of a metal and an inner cooling cylinder made of graphite or the like, which are located to concentrically surround a single-crystal ingot being pulled from the lower portion of the pull chamber toward the inside of the main chamber. This causes the heat produced in the inner cooling cylinder to be transferred outside via the outer cooling cylinder to reduce the temperature increase in the inner cooling cylinder, thereby improving the cooling efficiency for crystals.

Moreover, for effective cooling of a growing crystal, International publication No. WO01/057293, for example, discloses an apparatus wherein a coolant is circulated in a cooling cylinder 11 via a coolant inlet 12 to effect forced cooling.

Typically, cooled water is used as a coolant for use in cooling each of the chamber members and cooling cylinder. Since a large quantity of water is used, water that has been heated after passing through the inside of the coolant passage and cooling cylinder is cooled in a cooling apparatus, such as a cooling tower or the like, and then the cooled water is temporarily stored in a water tank and re-circulated.

Incidentally, in the production of silicon single crystals according to the Czochralski method, there are two types of point defects introduced at the crystal-growth interface; i.e., vacancies where a silicon atom is missing, and interstitial silicon due to the introduction of excess silicon atoms. The ratio of these two defects is determined according to the ratio of the crystal growth rate, V, relative to the temperature gradient near the solid-liquid interface, G, i.e., V/G. In the cooling process performed during crystal growth, the predominant point defects of these two point defects near the melting point cause an aggregation reaction. At this time, when vacancies are predominant, they are detected as void defects, so-called COPs (Crystal Originated Particles), FPDs (Flow Pattern Defects), or the like (the V-region). When the above-described vacancies and interstitial silicon are equal in quantity, they interact with each other to cause the pair-annihilation reaction, thus producing a silicon single crystal with an extremely small quantity of defects that are detectable in a crystal-quality inspection (the N-region). When interstitial silicon is predominant near the melting point, it manifests itself as dislocations (the I-region).

These silicon single crystals find their own applications, and all of them are required to have a stable crystal quality. In order to realize this, it is necessary to stabilize the ratio V/G of the crystal growth rate V relative to the temperature gradient G near the solid-liquid interface. To stabilize the ratio V/G of the crystal growth rate V relative to the temperature gradient G near the solid-liquid interface, it is necessary to correct the pulling rate and the like appropriately. In general, however, it is not easy to determine an appropriate amount of correction; in particular, in order to obtain crystals of uniform quality according to the multi-pulling method, wherein a plurality of crystals are produced in the same crucible, it is necessary to correct the pulling rate for each crystal to a lower rate, as required. Furthermore, this correction does not necessarily depend only upon the operating time; thus, it has been difficult to control the crystal quality by making corrections based on only the total operating time from the beginning of the crystal production.

DISCLOSURE OF THE INVENTION

Accordingly, the present invention was accomplished in view of these problems. An object of the invention is to provide an apparatus and a method for producing single crystals, for producing single crystals while easily stabilizing the crystal quality associated with aggregation defects and the like.

The invention was accomplished to achieve the above-mentioned object, and provides an apparatus for producing single crystals according to a Czochralski method, including, at least, a chamber that can be divided into a plurality of chambers; a crucible containing a raw material melt; a heat generator for heating the raw material melt; and a pull means that pulls a single crystal from the raw material melt via a wire or a shaft while rotating the single crystal; at least one of the plurality of divided chambers having a circulating coolant passage in which a circulating coolant for cooling the chamber circulates; and measuring means that respectively measure an inlet temperature, an outlet temperature, and a circulating coolant flow rate of the circulating coolant in the circulating coolant passage; the apparatus further including a calculating means that calculates a quantity of heat removed from the chamber and/or a proportion of the quantity of removed heat, from the measured values of the inlet temperature, outlet temperature, and circulating coolant flow rate in the circulating-coolant passage; and a pulling rate control means that controls a pulling rate of the single crystal based on the resulting quantity of removed heat and/or the resulting proportion of the quantity of removed heat.

Using this apparatus for producing single crystals, wherein at least one of the plurality of divided chambers has a circulating coolant passage in which a circulating coolant for cooling the chamber circulates; and measuring means that respectively measure an inlet temperature, an outlet temperature, and a circulating coolant flow rate of the circulating coolant in the circulating coolant passage; and which apparatus further includes a calculating means that calculates a quantity of heat removed from the chamber and/or a proportion of the quantity of removed heat, from the measured values of the inlet temperature, outlet temperature, and circulating coolant flow rate in the circulating coolant passage; and a pulling rate control means that controls a pulling rate of the single crystal based on the resulting quantity of removed heat and/or the resulting proportion of the quantity of removed heat, the single-crystal pulling rate can be easily corrected to an appropriate pulling rate, in order to stabilize the crystal quality against a variation in the quantity of heat removed from the chamber and/or the proportion of the quantity of removed heat. Consequently, single crystals with a stable crystal quality can be produced.

In this case, the calculating means that calculates the quantity of heat removed from the chamber and/or the proportion of the quantity of removed heat preferably calculates a quantity of removed heat and/or a proportion of the quantity of removed heat with respect to a target chamber having a correlation between a variation in the quantity of heat removed from the chamber and/or the proportion of the quantity of removed heat and a change in a crystal quality of the resulting single crystal.

In this way, when the calculating means that calculates the quantity of heat removed from the chamber and/or the proportion of the quantity of removed heat calculates a quantity of removed heat and/or a proportion of the quantity of removed heat with respect to a target chamber having a correlation between a variation in the quantity of heat removed from the chamber and/or the proportion of the quantity of removed heat and a change in a crystal quality of the resulting single crystal, the single-crystal pulling rate can be corrected more accurately to an appropriate pulling rate.

Further, the invention provides a method for producing single crystals according to a Czochralski method, at least, using an apparatus for producing single crystals that includes a chamber that can be divided into a plurality of chambers, the method including a first step of calculating a quantity of heat removed from at least one of the plurality of divided chambers and/or a proportion of the quantity of removed heat; a second step of investigating a relationship between a variation in the quantity of heat removed from the chamber and/or the proportion of the quantity of removed heat and a crystal quality of the resulting single crystal; a third step of determining a relationship between a quantity of heat removed from a chamber and/or a proportion of the quantity of removed heat and a single-crystal pulling rate that produces a desired crystal quality, with respect to a target chamber having a correlation between a variation in the quantity of heat removed from the chamber and/or the proportion of the quantity of removed heat and a change in a crystal quality of the resulting single crystal; a fourth step of correcting a set value of single-crystal pulling rate so as to give a pulling rate that produces a desired crystal quality, based on the quantity of heat removed from the target chamber and/or the proportion of the quantity of removed heat; and a fifth step of pulling a single crystal from a crucible at the corrected single-crystal pulling rate.

According to the method for producing single crystals that includes the above-mentioned steps, the single-crystal pulling rate can be corrected easily and accurately to an appropriate pulling rate, in order to stabilize the crystal quality against a variation in the quantity of heat removed from the chamber and/or the proportion of the quantity of removed heat. Consequently, single crystals can be produced while stabilizing the crystal quality.

In this case, after the single crystal has been pulled, a polycrystalline raw material may be additionally charged into the crucible and melted to form a raw material melt, and then the single-crystal pulling may be repeated again, thereby pulling two or more single crystals from the same crucible.

In this way, once a single crystal has been pulled, by additionally charging a polycrystalline raw material into the same crucible and melting the material to form a raw material melt, and then by repeating the single-crystal pulling again, single crystals can be produced while stabilizing the crystal quality, using the method for producing single crystals according to the invention, even in cases such as the so-called multi-pulling method, wherein two or more single crystals are pulled from the same crucible, and it is difficult to stabilize the crystal quality between the first crystal and the second and subsequent crystals.

The correction of the set value of single-crystal pulling rate to produce a desired crystal quality based on the relationship between the quantity of heat removed from the chamber and/or the proportion of the quantity of removed heat and the single-crystal pulling rate determined in the third step is preferably performed at least prior to the beginning of a stage of pulling a straight body portion of the single crystal.

In this way, when the correction of the set value of single-crystal pulling rate to produce a desired crystal quality is performed at least prior to the beginning of the stage of pulling the straight body portion of the single crystal, single crystals with a desired crystal quality can be produced with higher reliability and reproducibility.

The correction of the set value of single-crystal pulling rate to produce a desired crystal quality based on the relationship between the quantity of heat removed from the chamber and/or the proportion of the quantity of removed heat and the single-crystal pulling rate determined in the third step is preferably performed intermittently or continuously at least during the stage of pulling the straight body portion of the single crystal.

In this way, when the correction of the set value of single-crystal pulling rate to produce a desired crystal quality is performed intermittently or continuously at least during the stage of pulling the straight body portion of the single crystal, single crystals with a desired crystal quality can be produced even more reliably.

The resulting single crystal may be a defect-free silicon single crystal having a diameter of 200 mm or more, and whose entire radial surface is made of an N-region.

According to the method for producing single crystals of the invention, defect-free silicon single crystals having a diameter of 200 mm or more, and whose entire radial surface is made of an N-region, which are difficult to produce, can be produced with high reproducibility while stabilizing the crystal quality. Consequently, the yield of defect-free silicon single crystals whose entire radial surface is made of the N-region can be improved, and the manufacturing costs can be reduced.

Using the apparatus and method for producing single crystals of the invention, single crystals can be produced while stabilizing the crystal quality associated with aggregation defects, and the yield of single crystals with a target crystal quality can be dramatically improved. That is, any difference among the individual single crystals containing aggregation defects is minimized, and the yield can be dramatically improved in the production of defect-free single crystals whose entire radial surface is made of the N-region.

BEST MODE FOR CARRYING OUT THE INVENTION

The invention will be described in more detail below.

As described above, in order to grow a single crystal while stabilizing the crystal quality associated with aggregation defects (hereinafter, sometimes simply referred to as the "crystal quality"), it is necessary to stabilize the ratio V/G of the crystal growth rate V relative to the temperature gradient G near the solid-liquid interface. To stabilize the ratio V/G of the crystal growth rate V relative to the temperature gradient G near the solid-liquid interface, it is necessary to correct the pulling rate and the like appropriately; however, in general, it has not been easy to determine an appropriate amount of correction.

In order to solve this problem, the inventors made extensive experiments and considerations.

The temperature gradient G, which determines the predominant point defects near the solid-liquid interface, is typically determined by the structure of the hot-zone (HZ) components mainly made of a carbonaceous material. The nature of the temperature gradient G, however, lies in the quantity of heat radiation transferred from the single crystal surface into the inner surface of the chamber that is being cooled by a circulating coolant. It follows that, if there is no change in the surface state of the inner surface of the chamber and in the cooling state of the chamber, the temperature gradient in the single crystal should be constant all the time, excluding from consideration the influence of a change in the geometric positional relationship caused by, for example, moving the crucibles. In reality, however, as described above, it is necessary to appropriately correct the pulling rate to a lower rate, to continuously and stably produce single crystals of uniform quality. In particular, in the multi-pulling method wherein a plurality of single crystals are produced in the same crucible, it is necessary to appropriately correct the pulling rate for each crystal; moreover, this correction does not necessarily depend only upon the operating time, and also varies according to the lengths of the previously produced crystals, etc. Thus, it is difficult to control the crystal quality by making corrections based on only the total operating time from the beginning of the production of the single crystal. This influence cannot be neglected especially in producing crystals with an extremely small quantity of aggregation defects, i.e., so-called defect-free crystals whose entire radial surface is made of the N-region, and has been a factor for reducing the production yield.

From the relationship of the above-mentioned ratio V/G of the crystal growth rate V relative to the temperature gradient G near the solid-liquid interface, it is evident that the primary reason that the pulling rate must be reduced according to the operating time is because the temperature gradient in the crystal near the solid-liquid interface changes. This explains that the quantity of heat released from the crystal decreases according to the operating time. This is believed to be because, as the operating time passes, silicon oxide and the like evaporated from the raw material melt adhere to the inner surface of the chamber and cooling cylinder, thereby reducing the quantity of heat removed from the chamber and cooling cylinder.

For a more detailed investigation of the relationship among the quantity of removed heat, the single-crystal pulling rate, and the crystal quality, the inventors made the following experiments and considerations. The inventors measured the inlet and outlet temperatures of the circulating coolant flowing in each of the divided chambers, as well as the flow rate of the circulating coolant, in consideration of the delay caused by the time needed for the circulating coolant to pass through the circulating coolant passage, which is calculated from the pipe length, while making a correction to the pulling rate of the single crystal to obtain a defect-free crystal whose entire radial surface is made of the N-region. Subsequently, the inventors calculated the proportion of the quantity of heat removed from each chamber by the circulating coolant, and investigated the relationship between the results and the crystal quality.

As a result, the inventors found that an extremely favorable correlation is observed between the measured results of the proportion of the quantity of heat removed from a specific chamber, in particular, a chamber situated obliquely above when viewed from the crystal-growth interface (a top chamber), and the amounts of correction for the pulling rate.

More specifically, they found that, when the proportion of the quantity of heat removed from the top chamber increases, it is necessary to increase the pulling rate of the crystal; conversely, when the proportion of the quantity of removed heat decreases, it is necessary to reduce the pulling rate. The inventors conceived that the relationship between the two can be represented by a simple approximate expression, and, using the expression, an appropriate pulling rate for obtaining a defect-free crystal whose entire radial surface is made of the N-region can be estimated from the actual measured value of the quantity of heat removed from the specific chamber, thereby accomplishing the invention.

The apparatus and method for producing a semiconductor according to the invention is described in detail below, with reference to the attached drawings; however, the invention is not limited thereto.

Figure 1:
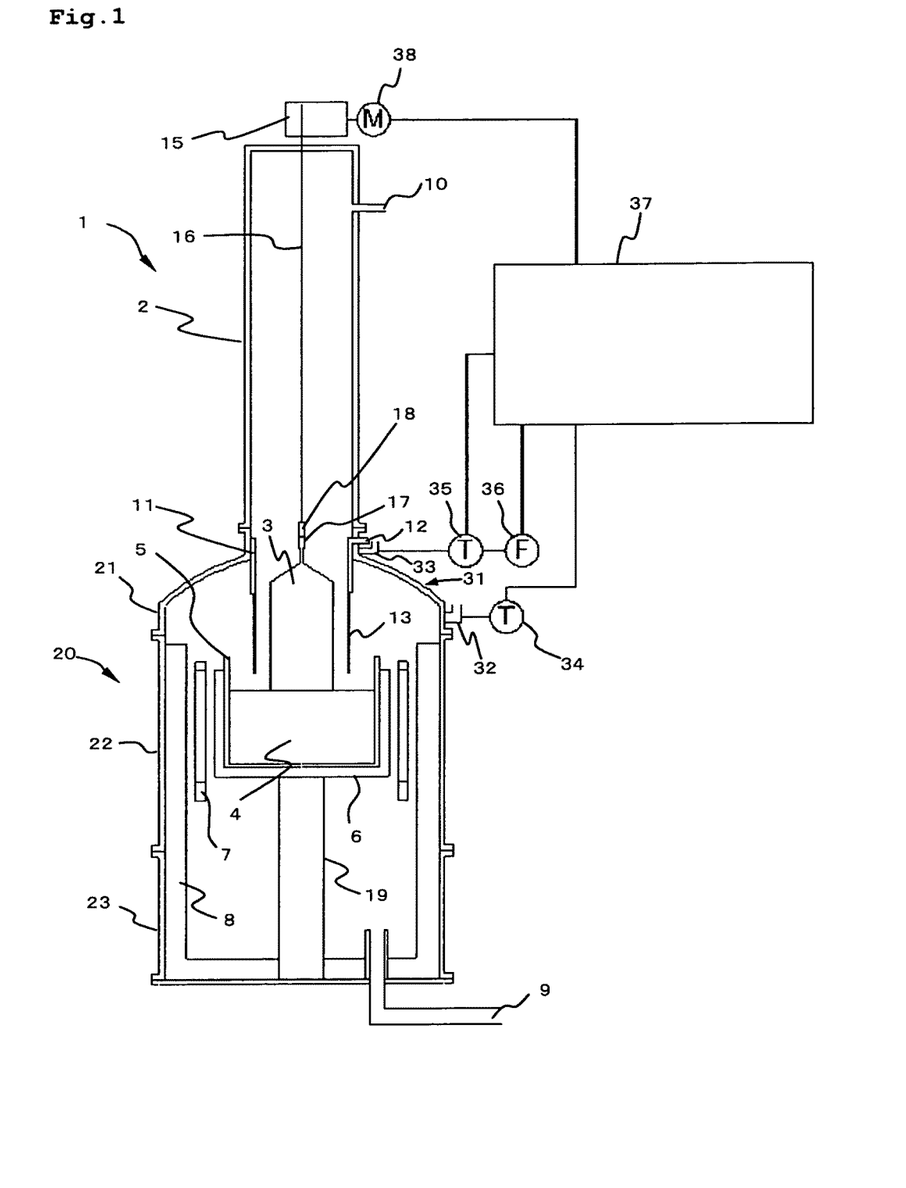
FIG. 1 is a schematic cross section showing an example of the single-crystal production apparatus according to the invention.

FIG. 1 is an example of the apparatus for producing a semiconductor according to the invention.

In the single-crystal production apparatus 1 shown in FIG. 1, a main chamber 20, which is composed of a top chamber 21, a middle chamber 22, a bottom chamber 23, and the like, houses crucibles 5, 6 that contain a raw material melt 4, a heat generator 7 for heating and melting the polycrystalline raw material, and the like. Located at the top of the pull chamber 2 immediately above the main chamber 20 is a pulling mechanism 15 for pulling a grown single crystal.

A pulling wire 16 is wound down from the pulling mechanism 15, and a seed holder 18 for mounting a seed crystal 17 is connected to the end of the wire. The seed crystal 17 mounted on the end of the seed holder 18 is immersed in the raw material melt 4, and the pulling wire 16 is wound up via the pulling mechanism. In this way, the single-crystal ingot 3 is pulled upward below the seed crystal 17 and grown.

When a silicon single crystal is produced, the crucibles 5 and 6 are composed of a quartz crucible 5 that directly contains a raw material melt 4 therein; and a graphite crucible 6 for supporting the quartz crucible 5. The crucibles 5, 6 are supported on a crucible-rotating shaft 19 that is capable of rotating and ascending or descending via a rotation drive mechanism (not shown) mounted at the bottom of the single-crystal production apparatus 1. The crucible-rotating shaft 19 raises the crucibles 5, 6 by the amount of reduction in the raw material melt 4 as the single-crystal ingot 3 is pulled upward, while rotating the crucibles in the opposite direction to the single-crystal ingot 3, in order to maintain the melt surface in a certain position so that the crystal quality is not varied by a change in the surface position of the raw material melt 4 in the single-crystal production apparatus 1.

The heat generator 7 is located to surround the crucibles 5, 6. On the exterior of the heat generator 7, a heat insulating member 8 is located to surround the heat generator 7 to prevent direct radiation of heat from the heat generator 7 into the main chamber 20.

For the purpose of, for example, discharging impurity gases produced inside the furnace from the furnace, an inert gas, such as argon gas or the like, is introduced into the pull chamber 2 and main chamber 20 via a gas inlet 10 located at an upper portion of the pull chamber 2. The inert gas passes the single-crystal ingot 3 being pulled and above the melt 4, and circulates in the pull chamber 2 and main chamber 20, after which it is discharged via a gas outlet 9.

In some cases, in order to cool the growing single crystal more effectively, the apparatus includes a cooling cylinder 11 that is forcibly cooled by a coolant that is introduced via a coolant inlet 12, and that extends from the ceiling of the main chamber toward the raw material melt surface to surround the single crystal being pulled; and may further include a cooling auxiliary member 13 that extends below the cooling cylinder 11.

The main chamber 20 and pull chamber 2, as well as cooling cylinder 11, are made of a metal with excellent heat resistance and thermal conductivity, such as stainless steel or the like.

The term simply referred to as a "chamber" hereinbelow encompasses the cooling cylinder 11 when the single-crystal production apparatus 1 includes it, in addition to a plurality of chamber members that constitute the main chamber 20, as well as the pull chamber 2.

Each of the chambers includes a circulating coolant passage 31 inside or on the exterior of the chamber member, and the circulating coolant passage 31 is configured so that a coolant for cooling the chamber circulates therein. Cooled water is typically used as a circulating coolant. In, for example, the top chamber 21, a circulating coolant is introduced via a circulating coolant passage inlet 32 into the circulating coolant passage 31 and passes therein, after which it is discharged via a circulating coolant passage outlet 33. The circulating coolant that has been heated after passing through the circulating coolant passage 31 is cooled in a cooling apparatus that is not shown in the figure, such as a cooling tower or the like, and then the cooled water is temporarily stored in a water tank and subsequently re-circulated.

In this way, each chamber is protected, and radiation of heat from the heat generator 7 is blocked so that it is not transferred outside of the single-crystal production apparatus 1.

In addition to this conventional structure, the single-crystal production apparatus 1 of the invention includes an inlet temperature measuring means 34 and an outlet temperature measuring means 35 at the circulating coolant passage inlet 32 and the circulating coolant passage outlet 33, respectively, and also includes a measuring means for circulating coolant flow rate 36 that measures the flow rate of the circulating coolant. The apparatus further includes a calculating means 37 that determines the quantity of heat removed from each chamber and/or the proportion of the quantity of heat removed from the chamber; and a pulling rate control means 38 that controls the pulling rate of the single crystal based on the determined quantity of removed heat and/or the proportion of the quantity of removed heat.

Using the single-crystal production apparatus 1 with this structure, single crystals are produced according to the method for producing single crystals of the invention.

Figure 3:
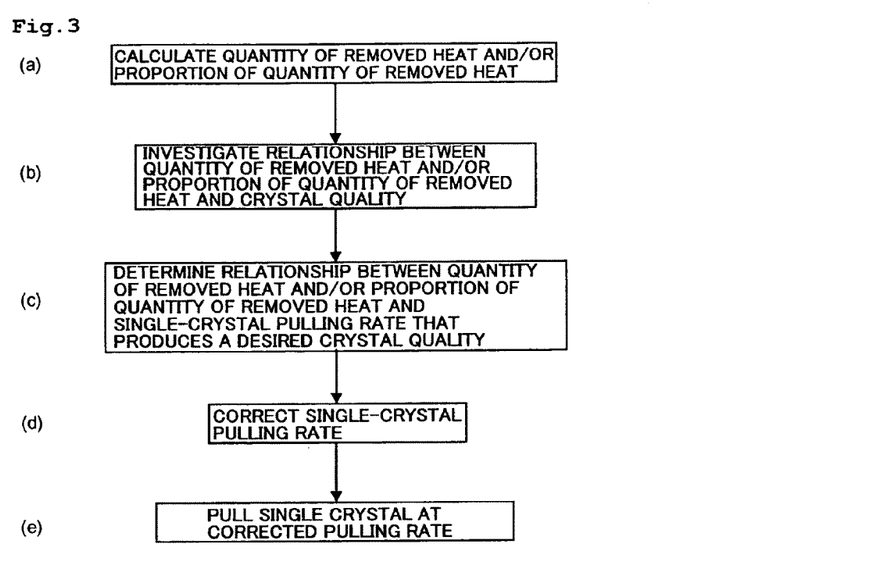
FIG. 3 is a flow chart showing exemplary steps of the method for producing single crystals according to the invention.

FIG. 3 shows exemplary steps of the method for producing single crystals of the invention.

In the method for producing single crystals according to the invention, the seed crystal 17 is first brought into contact with the raw material melt 4, and then the difference $\Delta T$ (° C.) between the inlet temperature T1 (° C.) and the outlet temperature T2 (° C.) of the circulating coolant for each chamber, as well as the flow rate L (l/min) of the circulating coolant, are measured, and the quantity of removed heat W (kW) is determined from these measured results (Step (a)).

At this time, when the circulating coolant is water, the quantity of removed heat W can be determined according to the following equation (1):

$$W(\text{kW}) = \Delta T(°\text{C.}) \times L(\text{l/min}) \times 4.1868(\text{kJ/kg·K})/60(\text{sec/min}) \quad (1)$$

wherein the coefficient 4.1868 (kJ/kg·K) is the specific heat of water. When a circulating coolant other than water is used, the quantity of removed heat may be calculated using the specific heat of the coolant.

The proportion of the quantity of heat removed from each of the divided chambers can be calculated by determining the quantity of heat removed from the entire single-crystal production apparatus, based on the inlet temperatures, outlet temperatures, and circulating coolant flow rates of the circulating coolant passages in the single-crystal production apparatus, according to the calculation expression shown above.

The difference $\Delta T$ in this case is preferably determined in consideration of the delay caused by the time of the passage of the circulating coolant. For example, when the time needed for the circulating coolant to pass through the chamber is 1 minute, the difference $\Delta T$ is preferably determined based on the difference from an inlet temperature of the chamber measured 1 minute before the time at which the outlet temperature was measured.

Each of the measuring apparatuses is not particularly limited, and a commonly used measuring apparatus can be used. For example, a Kalman-type flow rate measuring apparatus (with a measurement accuracy of ±2% of full scale) can be used, and a temperature measuring apparatus whose measurement accuracy has a display value of ±0.3° C. can be used. For example, when a Coriolis-type flow rate measuring apparatus (whose measurement accuracy has a display value of ±0.11%) and a temperature measuring apparatus whose measurement accuracy has a display value of ±0.01° C. are used, the measurement error of the quantity of removed heat can be minimized.

Next, the correlation among the quantity of heat removed from each chamber and/or the proportion of the quantity of removed heat, the difference between the reference crystal pulling rate and the actual pulling rate, and the crystal quality is investigated (Step (b)). Then, a chamber having a correlation between a variation in the quantity of removed heat and/or the proportion of the quantity of removed heat and the crystal quality is selected. At this time, a chamber having the highest correlation is preferably selected and handled according to the following process. For this purpose, the calculating means 37 that determines the quantity of heat removed from the chamber and/or the proportion of the quantity of removed heat is preferably configured to determine the quantity of heat removed from a chamber and/or the proportion of the quantity of removed heat with respect to a target chamber having a correlation between a variation in the quantity of removed heat and/or the proportion of the quantity of removed heat and a change in the crystal quality of the resulting single crystal.

The quantity of removed heat and/or the proportion of the quantity of removed heat may be determined for one of the divided chambers, or for a plurality of chambers having the above-mentioned correlation. Alternatively, the total quantity of removed heat and/or the total proportion of the quantity of removed heat may be determined from all of the chambers, and the following process may be performed based on this result.

Next, for each of the selected chambers, the relationship of the single-crystal pulling rate that produces a desired crystal quality (for example, the entire surface of the crystal in the diameter direction is made of the N-region) is determined from the quantity of removed heat and/or the proportion of the quantity of removed heat (Step (c)). At this time, this relationship is preferably determined in the form of an approximate expression (hereinafter sometimes referred to as a correction formula), to facilitate handling according to the following process.

Subsequently, from the quantity of heat removed from each of the selected chambers and/or the proportion of the quantity of removed heat, the set value of single-crystal pulling rate is corrected so as to give a pulling rate that produces a desired crystal quality (Step (d)). More specifically, the single-crystal pulling rate is preferably corrected based on the above-mentioned correction formula.

Next, the single crystal is pulled upward at the corrected pulling rate (Step (e)). More specifically, prior to the stage of pulling the straight body portion of the single crystal, the quantity of heat removed from the chamber and/or the proportion of the quantity of removed heat are/is determined, and then the pulling rate is corrected based on the above-mentioned correction equation for pulling rate that has been prepared.

Moreover, the quality of the pulled single crystal will be even more stabilized, if the quantity of heat removed from the chamber and/or the proportion of the quantity of removed heat are/is determined also during the step of pulling the straight body portion, and a correction is made so as to slightly adjust the pulling rate intermittently or continuously during the stage of pulling the straight body portion of the single crystal.

Furthermore, once the single crystal has been pulled, a polycrystalline raw material may be additionally charged into the same crucible, and melted to form a raw material melt, and then the single-crystal pulling may be repeated again, thereby pulling two or more single crystals from the same crucible. In this so-called multi-pulling method, single crystals can be produced while correcting the pulling rate by repeating the above-described Steps (d) to (e) also after pulling the second crystal.

In accordance with the method for producing single crystals described above, even single crystals of a crystal quality that is difficult to produce, such as defect-free silicon single crystals having a diameter of 200 mm or more, and whose entire radial surface is made of the N-region, can be produced with high reproducibility while stabilizing the crystal quality. As a result, the yield of defect-free silicon single crystals whose entire radial surface is made of the N-region can be improved, and the manufacturing costs can be reduced. Needless to say, the defect distribution of the single crystals to be produced is not limited to the N-region, and may vary depending on the purpose; single crystals with the V-region, I-region, or the like can also be pulled with high accuracy.

The present invention can be applied to various known CZ methods, such as the so-called MCZ method wherein a single crystal is pulled while applying a magnetic field, and the like.

EXAMPLES

The invention will be described in detail below with reference to the Example and Comparative Examples.

Example

Using the single-crystal production apparatus 1 shown in FIG. 1, silicon single crystals were produced as follows, according to the steps shown in FIG. 3, with the aim of producing the N-region in the entire surface of the crystal in the diameter direction.

Figure 4:
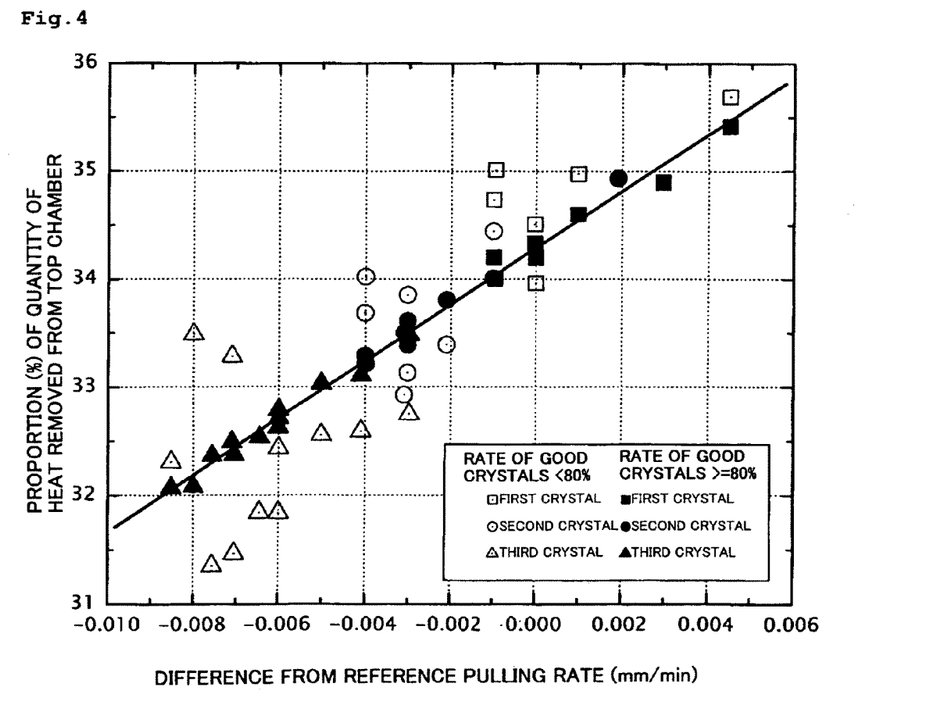
FIG. 4 is a graph showing the relationship between the proportion of the quantity of heat removed from the top chamber and the amount of correction based on the reference pulling rate that produces the N-region in the entire surface of the crystal in the diameter direction.

The relationship between the proportion of the quantity of heat removed from the top chamber measured 48 minutes after the beginning of necking and the pulling rate that produces the N-region in the entire surface of the crystal in the diameter direction was investigated beforehand (Steps (a) and (b)). The results are shown in FIG. 4. The proportion of the crystals whose entire surface in the diameter direction was made of the N-region was defined as the rate of good crystals. As is clear from FIG. 4, in the single-crystal production apparatus used in the Example, there was a strong correlation for the top chamber between the quantity of removed heat and/or the proportion of the quantity of removed heat and the crystal quality. At this point, the correction formula was determined, as indicated by the solid line in FIG. 4 (Step (c)).

320 kg of a silicon polycrystal was charged into a quartz crucible 5 with a diameter of 32 inches (800 mm), and a silicon single crystal with a diameter of 300 mm and a straight-body length of 1,200 mm was pulled while applying a horizontal magnetic field of 3,500 to 4,000 G at the coil center, with the pulling rate of the straight body portion set to 0.30 to 0.60 mm/min so as to produce the N-region in the entire surface of the crystal in the diameter direction, thereby pulling three silicon single crystals according to the multi-pulling method (Steps (d) and (e)). The pulling rate during the stage of pulling the straight body portion of the single crystal was corrected according to the correction formula indicated by the solid line in FIG. 4.

Figure 6:
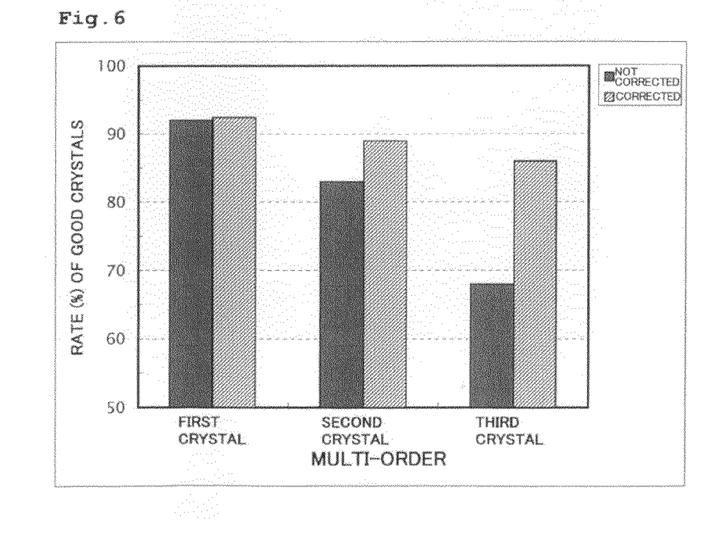
FIG. 6 is a graph comparing the proportions of the crystals whose entire surface in the diameter direction was made of the N-region between the Example and Comparative Example 1, as the rates of good crystals.

FIG. 6 shows the results obtained after performing this process for 10 batches. FIG. 6 is a graph wherein the abscissa represents the multi-order, which indicates the number of the times that the pulling was performed in the same crucible, and the ordinate represents the rate of good crystals. As shown in FIG. 6, the rate of good crystals was 93% for the first crystal, 89% for the second, and 86% for the third; therefore, extremely stable production was achieved.

Comparative Example 1

Silicon single crystals were produced with the aim of producing the N-region in the entire surface of the crystal in the diameter direction for 10 batches, according to the same method as the Example, except that the pulling rate during pulling the straight body was not corrected based on the proportion of the quantity of heat removed from the top chamber.

As a result, as shown in FIG. 6, the rate of good crystals was 92% for the first crystal, 83% for the second, and 68% for the third; therefore, the rate of good crystals decreased as the multi-order increased.

This is believed to be because, although the operating conditions were completely the same for the first to third crystals, oxide and the like adhered to the chamber surfaces as the operating time passed, causing the quantity of heat removed from each chamber to change, resulting in changes in the temperature gradient G near the solid-liquid interface, and changes in the pulling rate that produces the N-region in the entire surface of the crystal in the diameter direction; however, the pulling rate was not corrected according to these changes.

Comparative Example 2

Figure 5:
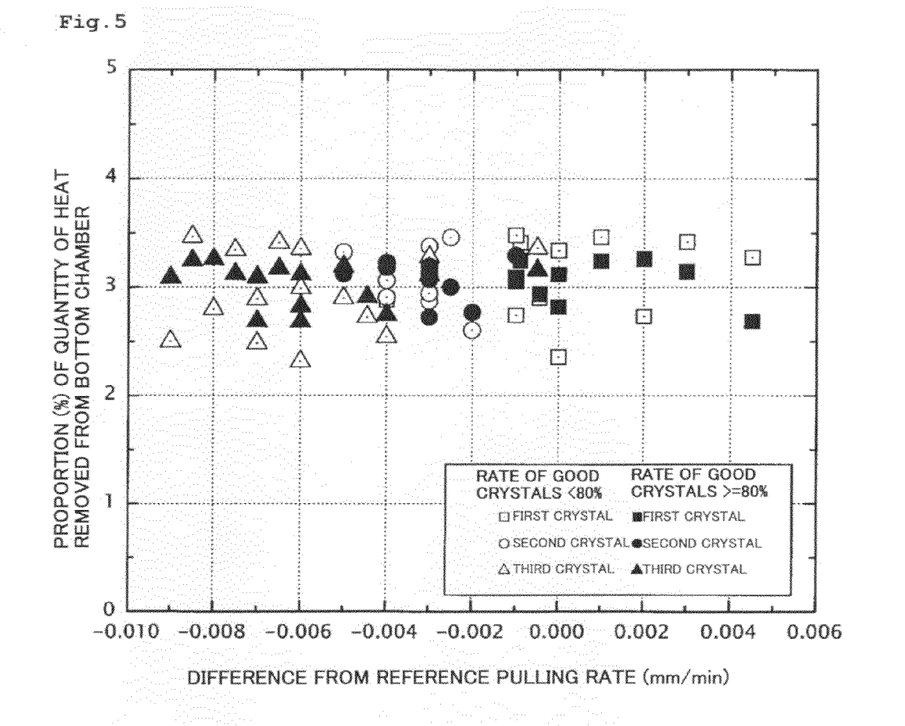
FIG. 5 is a graph showing the relationship between the proportion of the quantity of heat removed from the bottom chamber and the amount of correction based on the reference pulling rate that produces the N-region in the entire surface of the crystal in the diameter direction.

The relationship between the proportion of the quantity of heat removed from the bottom chamber measured 48 minutes after the beginning of necking and the pulling rate that produces the N-region in the entire surface of the crystal in the diameter direction was investigated beforehand. As a result, no correlation was observed as shown in FIG. 5, and it was difficult to correct the pulling rate to such a rate that produces the N-region in the entire surface of the crystal in the diameter direction based on the quantity of heat removed from the bottom chamber.

This is believed to be because, in the single-crystal production apparatus used in the Example and Comparative Examples, the bottom chamber is situated at the bottom of the main chamber, and hence, the proportion of the quantity of heat removed from the bottom chamber is extremely low, i.e., about 3%.

The present invention is not limited by the foregoing embodiments. The foregoing embodiments are merely illustrative, and any embodiment that has a structure substantially identical to the technical concept disclosed in the claims of the invention, and provides a similar effect is encompassed within the technical scope of the invention.

For example, while the foregoing embodiments have been described as mainly producing silicon single crystals, the invention can be similarly applied to crystals other than silicon, as long as the CZ method is employed.

In addition, in the foregoing Example and Comparative Examples, there was not a substantial correlation for the bottom chamber between the quantity of removed heat and/or the proportion of the removed heat and the crystal quality; however, in some cases, depending on the structure and the like of the single-crystal production apparatus, it may be appropriate to control the single-crystal pulling rate based on the measured results of the quantity of removed heat and/or the proportion of the quantity of removed heat for the bottom chamber or the like, rather than the top chamber.

The invention claimed is:

1. A method for producing single crystals according to a Czochralski method, at least, using an apparatus for producing single crystals comprising a chamber that can be divided into a plurality of chambers, the method comprising:
   a first step of calculating a quantity of heat removed from at least one of a plurality of divided chambers by cooling with a circulating coolant and/or a proportion of the quantity of removed heat;
   a second step of investigating a relationship between a variation in the quantity of removed heat from the chamber and/or the proportion of the quantity of removed heat and a crystal quality associated with aggregation defects of the resulting single crystal;
   a third step of determining a relationship between a quantity of removed heat from a chamber and/or a proportion of the quantity of removed heat and a single-crystal pulling rate that produces a desired crystal quality associated with aggregation defects, with respect to a target chamber having a correlation between a variation in the quantity of removed heat from the chamber and/or the proportion of the quantity of removed heat and a change in the crystal quality associated with aggregation defects of the resulting single crystal;

a fourth step of correcting a set value of single-crystal pulling rate so as to give a pulling rate that produces a desired crystal quality associated with aggregation defects, based on the quantity of removed heat from the target chamber and/or the proportion of the quantity of removed heat; and a fifth step of pulling a single crystal from a crucible at the corrected single-crystal pulling rate, wherein the quantity of heat removed from the at least one of the plurality of divided chambers by cooling with the circulating coolant, and/or the proportion of the quantity of removed heat, is calculated from measured values of an inlet temperature, an outlet temperature and a circulating coolant flow rate of the circulating coolant in a circulating coolant passage.

2. The method for producing single crystals according to claim 1, wherein, after the single crystal has been pulled, a polycrystalline raw material is additionally charged into the crucible and melted to form a raw material melt, and then the single-crystal pulling is repeated again, thereby pulling two or more single crystals from the same crucible.

3. The method for producing single crystals according to claim 1, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed at least prior to the beginning of a stage of pulling a straight body portion of the single crystal.

4. The method for producing single crystals according to claim 1, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed intermittently or continuously at least during a stage of pulling a straight body portion of the single crystal.

5. The method for producing single crystals according to claim 1, wherein the resulting single crystal is a defect-free silicon single crystal having a diameter of 200 mm or more, and whose entire radial surface is made of an N-region.

6. The method for producing single crystals according to claim 2, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed intermittently or continuously at least during a stage of pulling a straight body portion of the single crystal.

7. The method for producing single crystals according to claim 3, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed intermittently or continuously at least during the stage of pulling the straight body portion of the single crystal.

8. The method for producing single crystals according to claim 2, wherein the resulting single crystal is a defect-free silicon single crystal having a diameter of 200 mm or more, and whose entire radial surface is made of an N-region.

9. The method for producing single crystals according to claim 3, wherein the resulting single crystal is a defect-free silicon single crystal having a diameter of 200 mm or more, and whose entire radial surface is made of an N-region.

10. The method for producing single crystals according to claim 4, wherein the resulting single crystal is a defect-free silicon single crystal having a diameter of 200 mm or more, and whose entire radial surface is made of an N-region.

11. The method for producing single crystals according to claim 6, wherein the resulting single crystal is a defect-free silicon single crystal having a diameter of 200 mm or more, and whose entire radial surface is made of an N-region.

12. The method for producing single crystals according to claim 7, wherein the resulting single crystal is a defect-free silicon single crystal having a diameter of 200 mm or more, and whose entire radial surface is made of an N-region.

13. The method for producing single crystals according to claim 2, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed at least prior to the beginning of a stage of pulling a straight body portion of the single crystal.

14. The method for producing single crystals according to claim 13, wherein the resulting single crystal is a defect-free silicon single crystal having a diameter of 200 mm or more, and whose entire radial surface is made of an N-region.

15. The method for producing single crystals according to claim 13, wherein the correction of the set value of single-crystal pulling rate to produce the desired crystal quality associated with aggregation defects based on the relationship between the quantity of removed heat from the chamber and/or the proportion of the quantity of removed heat and the single-crystal pulling rate determined in the third step is performed intermittently or continuously at least during the stage of pulling the straight body portion of the single crystal.

16. The method for producing single crystals according to claim 15, wherein the resulting single crystal is a defect-free silicon single crystal having a diameter of 200 mm or more, and whose entire radial surface is made of an N-region.

* * * * *